United States Patent [19]
Masuda

[11] Patent Number: 5,229,636
[45] Date of Patent: Jul. 20, 1993

[54] NEGATIVE EFFECTIVE MASS SEMICONDUCTOR DEVICE AND CIRCUIT

[76] Inventor: Tatsuji Masuda, 491 Asouda-cho, Matsuyama-shi, Ehime-ken 790, Japan

[21] Appl. No.: 689,096

[22] Filed: Apr. 22, 1991

Related U.S. Application Data

[63] Continuation of Ser. No. 438,033, Nov. 20, 1989, abandoned, which is a continuation-in-part of Ser. No. 82,388, Sep. 1, 1987, abandoned.

[51] Int. Cl.$^5$ ............................................. H01L 29/90
[52] U.S. Cl. ..................................... 257/605; 257/603
[58] Field of Search ..................... 357/13, 14, 15, 57, 357/4, 68, 20; 257/603, 605

[56] References Cited

U.S. PATENT DOCUMENTS

| | | |
|---|---|---|
| 4,458,260 | 7/1984 | McIntyre et al. ............ 357/13 |
| 5,057,879 | 10/1991 | Pigott et al. ............ 357/13 |

FOREIGN PATENT DOCUMENTS

| | | | |
|---|---|---|---|
| 48-35776 | 5/1973 | Japan | 357/13 |
| 52-10084 | 1/1977 | Japan | 357/130 |
| 59-211283 | 11/1984 | Japan | 357/13 |
| 59-211284 | 11/1984 | Japan | 357/57 |
| 60-49678 | 3/1985 | Japan | 357/13 |
| 61-142777 | 6/1986 | Japan | 357/13 |
| 0142777 | 6/1986 | Japan | 357/13 |
| WO-8703426 | 6/1987 | World Int. Prop. O. | 357/57 |

Primary Examiner—Rolf Hille
Assistant Examiner—Minhloan Tran
Attorney, Agent, or Firm—Parkhurst, Wendel & Rossi

[57] ABSTRACT

An active semiconductor device having a negative resistance based upon a negative effective mass of carriers in the semiconductor. A PN junction formed between semiconductor regions of P and N conductivity types is biased in a constant steady state current condition of a fixed reversible break down in the reverse direction based on the avalanche phenomenon, then the carriers may have negative effective mass in all directions within the region in which the carriers moved out of the transition region and are not so many times scattered by the lattice. The negative resistance relying upon this condition can be directly obtained as output by providing two output electrodes on one of the surfaces of the two types of semiconductor regions which sandwich the PN junction.

5 Claims, 1 Drawing Sheet

FIG_1
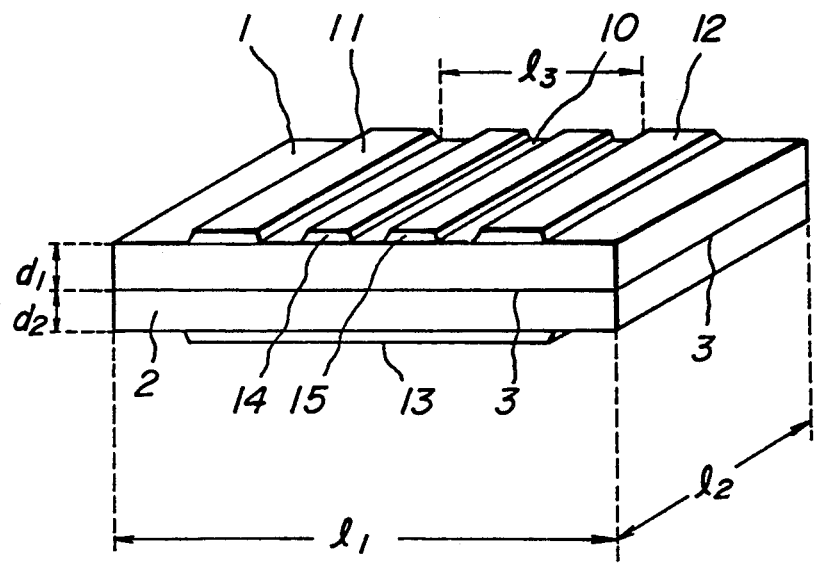
FIG_2
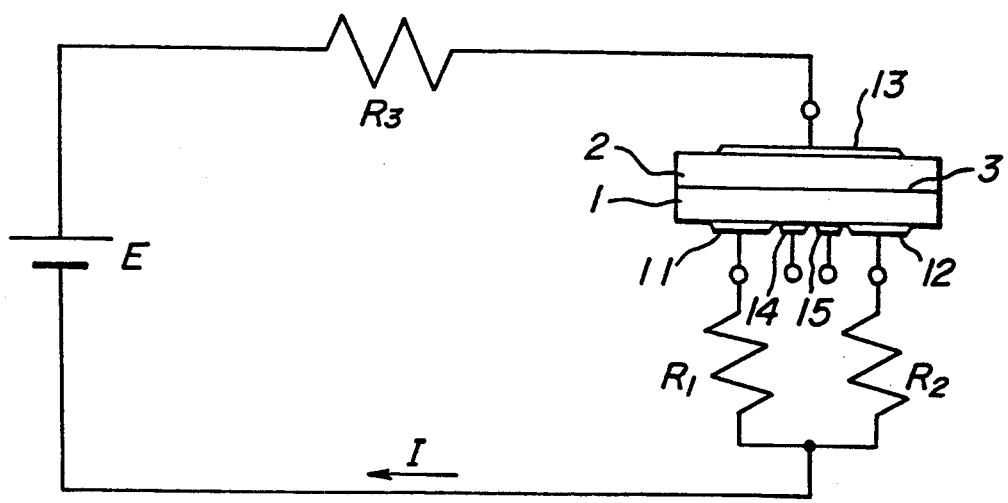

NEGATIVE EFFECTIVE MASS SEMICONDUCTOR DEVICE AND CIRCUIT

This is a continuation of application Ser. No. 07/438,033 filed Nov. 20, 1989, now abandoned, which is a continuation-in-part of Ser. No. 07/082,388, filed Sep. 1, 1987, now abandoned.

TECHNICAL FIELD

This invention relates to an active semi-conductor device having a negative resistance based upon a negative effective mass of carriers in a semiconductor.

BACKGROUND ART

As an active semiconductor device utilizing a negative effective mass of carriers in a semiconductor, there have been proposed a device utilizing the negative effective mass which exists in a direction parallel to the applied acceleration field (longitudinal negative effective mass) in a wave number space and a device utilizing the negative effective mass which exists in a direction perpendicular to the applied acceleration field (transverse negative effective mass) based upon distortion of energy front of the wave number space. In these two kinds of devices, it is necessary to accelerate the carriers upto an energy region in which the negative effective mass is existence, and it is inevitable for the carriers not to subject to a scattering by a lattice before they reach the region. Then, these devices require particular conditions with respect to its structure, ambient temperature or the like (See, H. Kroemer: Proc. IRE. 47 (1959) p. 393, L. Esaki and R. Tsu, IBM. Res. Develop 14, 61 (1970).

DISCLOSURE OF THE INVENTION

The present invention has for its object to provide an active semiconductor device which is formed to obtain a negative resistance by causing with the carriers a condition having a negative effective mass in a different way from these devices.

When a PN junction formed between semiconductor regions of P and N conductivity types is biased in a constant current condition of a fixed reversible break down in the reverse direction based on the avalanche phenomenon, the carriers (electrons and holes) caused by the avalanche phenomenon are accelerated repeatedly with an energy between a maximum energy and a minimum energy in the transition region of the junction, so that the carriers having the mean effective mass can have a mean negative effective mass in a direction perpendicular to the applied acceleration electric field during acceleration, move outside the transition region, are scattered isotropically by the lattice and establish a wave number space high-energy distribution condition having a mean negative effective mass in all direction within the region in which the carriers are not so may times scattered by the lattice.

When the absolute value of the negative resistance based upon this condition is either equal to or under the value of the positive resistance parallel to the negative resistance, a bistable or an oscillation condition is caused across these two resistances. These two conditions may be directly obtained as output to produce an active function by providing two electrodes on the surface of at least one of the two regions between which the junction is sandwiched.

BRIEF DESCRIPTION OF THE DRAWINGS

FIG. 1 is a perspective view of a preferred form of an active semiconductor device according to the invention, and FIG. 2 is a fundamental circuit diagram for operating the device of FIG. 1.

1 ... semiconductor region of P conductivity type,
2 ... semiconductor region of N conductivity type,
3 ... planer PN junction
10 ... semiconductor device,
11, 12, 13, 14, 15 ... electrodes,
$R_1, R_2, R_3$ ... resistor,
E ... power source,
I ... current.

BEST MODE FOR CARRYING OUT THE INVENTION

FIG. 1 is a perspective view of a preferred form of an active semiconductor device according to the invention.

In FIG. 1, a semiconductor body 10 of the semiconductor device according to the present invention comprises a silicon semiconductor region 2 of P conductivity type as a substrate, a silicon semiconductor region 1 of N conductivity type, and a PN junction 3 formed therebetween. These two regions can be reversed with each other. In the present embodiment, the PN junction 3 is a planer junction. The semiconductor body 10 further comprises two electrodes 11 and 12 on the surface of the semiconductor region 1, two control electrodes 14 and 15 on the surface of the semiconductor region 1 between the electrodes 11 and 12 and an electrode 13 on the surface of the semiconductor region 2. Moreover, these electrodes 11, 12, 14 and 15 have a rectangular shape and are provided parallel to each other so as to utilize the negative resistance efficiently. These electrodes 11 or 12 and 13 are applied with a voltage of reversible break-down condition in the reverse direction which is based on the avalanche phenomen of carriers. The control electrodes 14 and 15 are applied with control signals. As shown in FIG. 1, the thickness $d_2$ of the N type semiconductor region 2 and the thickness $d_1$ of the P type semiconductor region 1 are defined such as $d_1 \simeq 3\ \mu$ and $d_2 \simeq 1\ \mu$, and the width $l_1$ and the length $l_2$ of these two semiconductor regions 1 and 2 are defined such as $l_1 \simeq 20\ \mu$ and $l_2 \simeq 10\ \mu$ as well as the space $l_3$ between the electrode 11 and 12 provided on the P type semiconductor region 1 is defined such as about 5 $\mu$.

The electrodes 11 and 12 serve also to apply a reverse voltage to the PN junction together with the electrode 13 which is provided on the N type semiconductor region 2 of the device. The provision of the electrodes, in this way, makes an external circuit being connected to the semiconductor device simple and the inherent high speed operation may also be utilized.

This is because in the case of silicon semiconductor the mean energy during accelerated time of carriers (electrons and holes) in the transition region of the PN junction is about 3.0 eV and 4.4 eV, respectively, at these energies the mean effective mass of electrons and holes can be negative and 1.9 eV in the case of electrons and 3.0 eV in the case of holes which are the minimum limit of energy at which the mean effective mass can be negative and so the mean effective mass can be maintained to be negative in the case that the number of scattered times of electrons and holes is under about 200 times when the loss of energy of carriers is 0.005 eV and within the region of 200 times of the mean free path of electrons and holes which is 0.1 μ, the mean effective mass can be maintained to be negative and the length thereof is 20 μ.

FIG. 2 is a fundamental circuit diagram for operating the present semiconductor device. In FIG. 2, resistors $R_1$ and $R_2$ are connected to the terminals 11 and 12, respectively, and have an equal value due to a symmetrical formation of the device, so that the output thereof can be obtained as a balanced output between the terminals 11 and 12. A resistor $R_3$ is connected to the terminal 13 in series to the device and serves to control the current I, and E is a power supply source.

Then, assuming that the negative resistance of the device is $-R_N$ and the positive resistance parallel to it is $R_P$, the operating condition of the semiconductor device according to the values of these two resistances is as follows. As the current I increases in the avalanche break down condition of the junction, the absolute value of the negative resistance $(-R_N)$ decreases. When the absolute value becomes equal to the value of the positive resistance $R_P$ ($R_N=R_P$), the device becomes a bistable condition and then a constant voltage may be obtained between the terminals 11 and 12. The voltage increases as the current I increases, and this bistable condition remains while the mean value of the effective mass at the energy distribution condition in the wave number space of carriers keeps negative value. The polarity of the voltage caused between the terminals 11 and 12 can be controlled from outside by providing control electrodes 14 and 15 on at least one of the regions which sandwich the junction. In this condition the device can be utilized as a bistable operational device. Further, when the current I is increased, a condition that $R_N$ becomes smaller than $R_P$ ($R_N<R_P$) may be obtained. In this condition, the device becomes a condition capable of oscillating between the terminals 11 and 12. Then, in this condition, the device may be utilized as an oscillator by providing a capacitance and a reactance between the terminals 11 and 12.

For example, in the case that the resistors $R_1$, $R_2$ and $R_3$ of the circuit using the present semiconductor device is defined such as $R_1=R_2=0.3$ kΩ and $R_3=0$ kΩ, the output voltage thereof in a bistable condition increases from 0.45 V to 1.0 V as the current I increases from 2.0 mA to 4.0 mA and the oscillation frequency is about 100 MHz~400 MHz when the current I is about 4.0 mA. Besides, in the range of the bistable condition the current passing through one of the resistors $R_1$ and $R_2$ rise up from 1.0 mA to 1.8 mA and the current passing through the other of the resistors fall down from 1.0 mA to 0.3 mA.

Moreover, in the case that the total amount of resistance of these resistors $R_1$, $R_2$ and $R_3$ of the circuit using the present semiconductor device is 1 kΩ, the output voltage thereof in a bistable condition is about 1.0 V~1.5 V when the current is about 6 mA~10 mA, and in the case that the value of $R_N$ and $R_P$ is defined as $R_N=R_P\approx 1.5$ kΩ, because $R_P$ is defined such as $R_P=R_1+R_2/R_1+R_2+R_3$, the oscillation frequency is about 100 MHz~300 MHz when the current 1 is about 10 mA.

INDUSTRIAL APPLICABILITY

As described above, the semiconductor device according to the present invention does not require a particular condition for the structure and the temperature or the like, since the condition of carriers having the negative effective mass utilizes a fixed reversible break down condition in the direction based on avalanche phenomenon of carriers at the junction.

What is claimed is:

1. A semiconductor device comprising:
 a semiconductor body comprising two semiconductor regions of P and N conductivity types, said two semiconductor regions forming a PN junction therebetween, said PN junction being reversibly applied an avalanche breakdown voltage such that carriers are exited to have negative effective mass in a transition region of said PN junction in a reversible avalanche breakdown condition;
 two output electrodes provided on at least one of said two semiconductor regions to apply reversibly said avalanche breakdown voltage to said PN junction; an
 at least one electrode provided on the other of said two semiconductor regions for applying reversibly said avalanche breakdown voltage to said PN junction with said two output electrodes;
 whereby said two semiconductor regions are limited within areas near said transition region such that said carriers moving out of said transition region have not been many times scattered by atoms of said two semiconductor regions until said carriers have moved to each of said electrodes of said two semiconductor regions, whereby negative resistance by said negative effective mass of said carriers in said reversible avalanche breakdown condition is obtained between said two output electrodes.

2. The semiconductor device of claim 1, further comprising two control electrodes provided on said at least one of the semiconductor regions and between said two output electrodes.

3. A circuit for providing an output of negative resistance at an output, comprising:
 (a) a semiconductor body comprising two semiconductor regions of P and N conductivity types, said two semiconductor regions forming a PN junction therebetween, said PN junction being reversibly applied an avalanche breakdown voltage such that carriers are exited to have negative effective mass in a transition region of said PN junction in a reversible avalanche breakdown condition;
 two output electrodes provided on one of said two semiconductor regions to apply reversibly said avalanche breakdown voltage to said PN junction; and
 at least one electrode provided on the other of said two semiconductor regions for applying reversibly said avalanche breakdown voltage to said PN junction with said two output electrodes;
 whereby said two semiconductor regions are limited within areas near said transition region such that said carriers moving out of said transition region have not been many times scattered by atoms of said two semiconductor regions until said carriers have moved to each of said electrodes of said two semiconductor regions;
 (b) resistors connected to each of said electrodes of said two semiconductor regions; and
 (c) a power source coupled between said two semiconductor regions through each of said resistors, said power source providing said avalanche breakdown voltage for reversible application to said PN junction for operation in said reversible avalanche breakdown condition, whereby an active function of negative resistance by said negative effective mass of said carriers in said reversible breakdown condition is obtained between said two output electrodes.

4. A circuit for providing an output of negative resistance at an output, comprising:
   (a) a semiconductor body comprising two semiconductor regions of P and N conductivity types, said two semiconductor regions form a PN junction therebetween, said PN junction being reversibly applied an avalanche breakdown voltage such that carriers are exited to have negative effective mass in the transition region of said PN junction in a reversible avalanche breakdown condition;
   two output electrodes provided on at least one of said two semiconductor regions to apply reversibly said avalanche breakdown voltage to said PN junction;
   at least one electrode provided on the other of said two semiconductor regions for applying reversibly said avalanche breakdown voltage to said PN junction with said two output electrodes;
   whereby said two semiconductor regions are limited within areas near said transition region such that said carriers moving out of said transition region have not been many times scattered by atoms of said two semiconductor regions until said carriers have moved to each of said electrodes of said two semiconductor regions;
   (b) two control electrodes provided on said at least one of the semiconductor regions and between said two output electrodes;
   (c) resistors connected to each of said electrodes of said two semiconductor regions;
   (d) a power source coupled between said two semiconductor regions through each of said resistors, said power source providing said avalanche breakdown voltage for reversible application to said PN junction to operate in said reversible avalanche breakdown condition;
   whereby a bistable function controlled by an input signal applied by said two control electrodes is obtained between said two output electrodes.

5. The circuit of claim 4, further comprising capacitive and inductive reactance in series between said two output electrodes, whereby an oscillation function is obtained between said two output electrodes.

* * * * *